United States Patent
Maa et al.

(10) Patent No.: US 6,218,249 B1
(45) Date of Patent: Apr. 17, 2001

(54) MOS TRANSISTOR HAVING SHALLOW SOURCE/DRAIN JUNCTIONS AND LOW LEAKAGE CURRENT

(75) Inventors: Jer-Shen Maa, Vancouver; Sheng Teng Hsu, Camas; Chien-Hsiung Peng, Vancouver, all of WA (US)

(73) Assignees: Sharp Laboratories of America, Inc., Camas, WA (US); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/455,588

(22) Filed: Dec. 6, 1999

Related U.S. Application Data

(62) Division of application No. 09/023,383, filed on Feb. 13, 1998, now Pat. No. 6,071,782.

(51) Int. Cl.[7] ................................................. H01L 21/336
(52) U.S. Cl. .......................... 438/300; 438/290; 438/294; 438/308
(58) Field of Search .................................. 257/382, 384, 257/649, 655; 438/300

(56) References Cited

U.S. PATENT DOCUMENTS

| | | | |
|---|---|---|---|
| 5,567,651 | * 10/1996 | Berti et al. | 437/200 |
| 5,840,626 | * 11/1998 | Ohguro | 438/649 |
| 5,953,633 | * 9/1999 | Chen et al. | 438/683 |
| 5,998,248 | * 12/1999 | Ma et al. | 438/231 |
| 6,001,738 | * 12/1999 | Lin et al. | 438/683 |
| 6,004,878 | * 12/1999 | Thomas et al. | 488/655 |

FOREIGN PATENT DOCUMENTS

| | | |
|---|---|---|
| 4401341A1 | 7/1994 | (DE) . |
| 4443593A1 | 6/1995 | (DE) . |
| 0501561A1 | 11/1992 | (EP) . |
| 2296506A | 3/1996 | (GB) . |
| 7-283168 | 10/1995 | (JP) . |
| 8-125182 | 5/1996 | (JP) . |
| 9-069497 | 3/1997 | (JP) . |

OTHER PUBLICATIONS

Hsiaot E. et al., "An Advanced GE Premorphization Salicide Technology for Ultra–Thin Film OSI CMOS Devices"; IEEE Electron Device Letters, vol. 18, No. 7, pp. 309–311.
Bing–Yue Tsui et al., "Contact Resistivity of Shallow Junctions Formed by Implantation through PT or PTSI", Solid State Electronics, vol. 35, No. 9, pp. 1217–1222.

\* cited by examiner

Primary Examiner—Olik Chaudhuri
Assistant Examiner—Wai-Sing Louie
(74) Attorney, Agent, or Firm—David C. Ripma; Matthew D. Rabdau; Scott C. Kreiger

(57) ABSTRACT

A process of forming silicide at uniform rates across the entire source/drain region is provided. A two-step annealing method permits the thickness of the silicide formed on the edge of a silicon electrode to be substantially the same as it is in the center of the electrode. A first, low temperature anneal begins the salicidation process across the source/drain electrode surface. The time and temperature are controlled so that the metal is only partially consumed. The annealing is interrupted to remove excess silicidation metal, especially the unreacted metal overlying oxide areas neighboring the silicon electrode. Then, the silicidation is completed at a higher temperature anneal. Because the excess metal has been removed, the resulting silicide layer is uniformly flat, permitting the transistor to be fabricated with shallow junction areas and low leakage currents. In one embodiment of the invention, the crystalline structure of source and drain surfaces is annihilated before the deposition of metal, to lower annealing temperatures and add precise control to the silicidation process. A transistor having a uniformly thick silicide layer, fabricated in accordance with the above-mentioned method, is also provided.

2 Claims, 8 Drawing Sheets

(PRIOT ART)

(PRIOT ART)

(PRIOT ART)

(PRIOT ART)

(PRIOT ART)

MOS TRANSISTOR HAVING SHALLOW SOURCE/DRAIN JUNCTIONS AND LOW LEAKAGE CURRENT

This application is a divisional of application Ser. No. 09/023,383, filed Feb. 13, 1998, entitled "Partial Silicidation Method to Form shallow Source/Drain Junctions," invented by Jer-shen Maa et al, now U.S. Pat. No. 6,071,782.

BACKGROUND AND SUMMARY OF THE INVENTION

This invention relates generally to semiconductor technology and more particularly to the formation of silicided electrodes in active semiconductor devices, such as MOS transistors.

An important subject of ongoing research in the semiconductor industry is the reduction in the dimensions of devices used in integrated circuits. Planar transistors such as metal oxide semiconductor (MOS) transistors are particularly suited to use in high density integrated circuits. As the size of MOS transistors and other active devices decreases, the dimensions of the source/drain/gate electrodes, and the channel region of each device, decrease correspondingly.

The design of ever smaller planar transistors with short channel lengths makes it necessary to provide very shallow source/drain junction regions. Shallow junctions are necessary to avoid lateral diffusion of implantation dopants into the channel such diffusion being undesirable because it contributes to leakage currents and poor breakdown performance. Shallow source/drain junction regions, for example, less than 1000 angstroms (Å) thick, and preferably less than 500 Å thick, are necessary for acceptable performance in short channel devices.

When shallow junction electrodes are used in transistors, it becomes more difficult to provide reliable, low resistance connections to the source/drain regions of the device. Metal-silicide contacts are a typical means of effecting such connections to source/drain/gate electrodes. In such contacts, conductive metal is deposited on the silicon electrodes and annealed to form a metal-silicon compound on the surface of the electrodes. The compound, called silicide, is electrically and physically bonded to the electrode, and has a substantially lower sheet resistance than the silicon on which it is formed. An important advantage of silicide contacts in small devices is that silicide is only formed where the deposited metal is in contact with silicon. By means of a selective etch, the metal is readily removed from the non-silicided areas. Thus, the silicide regions are automatically aligned on the electrode surfaces only. This self-aligned silicide process is generally referred to as the "salicide" process.

One difficulty presented by the salicide process on shallow junction source and drain regions is that it consumes a portion of the surface silicon. The metal-silicide is formed from a chemical reaction which occurs during an annealing step, when the deposited metal reacts with the underlying silicon. Electrodes with very thin junction depths have less silicon to sacrifice to the formation of silicide, and can only permit a very thin layer of silicide to be formed. But thin silicide films are known to be thermally unstable and have an undesirably high sheet resistance.

One prior art technique for increasing the thickness of the silicide contacts is to deposit additional silicon on the surface of the doped source and drain regions. The additional silicon in the raised source and drain electrodes can then be used in the reaction with deposited metal to form thicker silicide layers. This solution has disadvantages because the deposition of additional silicon produces additional diffusion of dopants, and addition process steps and costs to IC production.

It is a well observed fact that inconsistent junction leakage currents often result from the salicidation of source/drain electrodes. It is believed that the random leakage phenomena is the result of silicide edges. The formation of "excess" silicide, into the source/drain areas around the edges of the source/drain electrodes, and in close proximity to the metallurgical edges of the junction areas underlying the source/drain electrodes, leads to the leakage current problem. These incursions, perturbations, or areas of increased thickness of silicide cause large electric field variances, and may even permit electrical conductivity extending through the junctions. While the amount of silicide formed on the main body of the source/drain electrodes is controlled by the thickness of the deposited silicidation metal, additional supplies of the metal are available around the edges of the source/drain electrodes where the metal is deposited on non-reacting surfaces, such as oxides.

A co-pending patent application entitled NITRIDE OVERHANG STRUCTURE FOR THE SILICIDATION OF TRANSISTOR ELECTRODES WITH SHALLOW JUNCTIONS, invented by Maa et al., filed on Feb. 13, 1998, and assigned to the same assignees as the instant patent application, presents a solution to the problem of silicided edges. In the above-mentioned application, a temporary nitride sidewall structure is used to prevent the deposition of silicidation metal on the edge of the source/drain electrodes adjoining the gate electrode. However, it is not convenient to use nitride overhang structures in some IC processes.

It would be advantageous if an improved silicide process were available to permit the fabrication of shallow junction areas with small leakage currents.

It would be advantageous if a silicidation metal could be formed on selective surfaces to control formation of silicide.

It would be advantageous if the thickness and the thickness tolerances of silicide layers formed on source/drain electrodes could be better controlled to maintain a consistent separation between the silicide and the junction area metallurgical edges.

Accordingly, in a MOS transistor, a method of forming shallow source/drain junctions with low leakage currents has been provided. The method comprises the steps of a) in a bulk silicon substrate well, forming silicon source/drain regions with an overlying gate electrode. The source/drain regions can be defined using any conventional technique;

b) depositing a layer of metal, having a predetermined metal thickness over the transistor, the metal is typically deposited through a physical vapor deposition (PVD), such as sputtering or evaporation, or even chemical vapor deposition methods (CVD). Possible silicidation metals include Co, Ni, Ti Mo, Ta, W, Cr, Pt, and Pd. When Co and Ni are used, the predetermined thickness of metal is in the range between 50 and 1000 Å, c) performing a first annealing of the metal deposited in Step b). Co is annealed at a temperature in the range between 300 and 500 degrees C. to partially react the metal with the silicon of the source/drain top surfaces, whereby metal-rich silicide compounds are formed. When Ni is selected, the temperature is in the range between 150 and 400 degrees C. Using either metal, the period of time is in the range between 2 and 20 seconds;

d) removing the metal deposited in Step b) not silicided in Step c), whereby silicide compounds remain on the source/drain top surfaces; and e) performing a second annealing of the silicide compounds formed in Step c) to complete the reaction of the metal and the silicon, forming a low resistance silicide layer having a silicide layer thickness and silicide layer thickness tolerance overlying the source/drain top surfaces. With Co, the temperature is in the range between 600 and 850 degrees C. and the period of time is in the range between 10 and 60 seconds. With Ni, the temperature is approximately 500 degrees C. and the period of time is in the range between 10 and 30 seconds. The silicide thickness formed is in the range between 100 and 500 Å, and the silicide thickness tolerance is less than 50% of the disilicide thickness. The silicide minimally penetrates into the silicon around the edges of the source/drain top surfaces.

The junction areas can be formed either before, or after silicidation. Either way, the source/drain junction areas have metallurgical edges formed at a junction depth of between 300 and 2000 Å from the source/drain top surfaces.

In some aspects of the invention, a further step follows Step a), and precedes Step b) of:

$a_2$) amorphousizing the crystalline structure of the source/drain top surfaces to a depth of 100 to 500 Å, whereby the source/drain top surfaces are prepared for the process of silicidation.

A MOS transistor having shallow source/drain junctions with low leakage currents is also provided. The transistor comprises silicon source/drain regions having top surfaces. The transistor also comprises source/drain junction areas with metallurgical edges at a predetermined junction depth from the respective source/drain top surfaces. Low resistance silicide layers having a predetermined silicide layer thickness overlie the source/drain top surfaces. The silicide layer has a silicide thickness tolerance, whereby the spacing between the metallurgical edge and the silicide layer is maximized by preventing the incursion of silicide into the silicon source/drain top surfaces.

Further, a process for forming a MOS transistor product having shallow source/drain junctions with low leakage current is described. The transistor comprises silicon source/drain regions having top surfaces. The transistor also comprises source/drain junction areas with metallurgical edges at a predetermined junction depth from the respective source/drain top surfaces. Low resistance silicide layers having a predetermined silicide layer thickness overlie the source/drain top surfaces. A silicide thickness tolerance, formed by depositing a predetermined thickness of metal overlying the source/drain top surfaces, partially siliciding said metal and the source/drain regions at a first predetermined annealing temperature for a first period of time, removing unreacted metal, and completing silicidation at a second predetermined annealing temperature for a second period of time, is created. In some aspects of the invention, the source/drain top surfaces are prepared for silicidation, before the deposition of silicide metal, by amorphousizing the surfaces to a thickness of 100 to 500 Å.

DETAILED DESCRIPTION OF THE PREFERRED EMBODIMENTS

Figure 1:
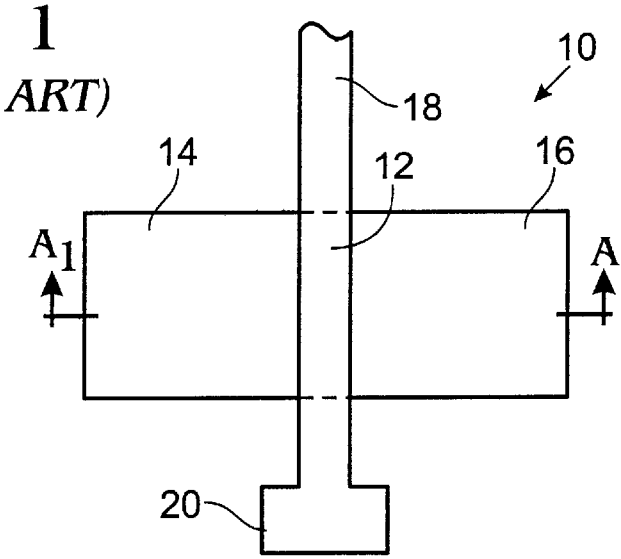
FIGS. 1–5 are steps in the fabrication of a completed MOS transistor with silicided source/drain electrodes (prior art).

FIGS. 1–5 are steps in the fabrication of a completed MOS transistor with silicided source/drain electrodes (prior art). FIG. 1 is a plan view of a MOS transistor 10 (prior art). Transistor 10 is formed on a silicon substrate and comprises a gate electrode 12 overlying a source region 14 and a drain region 16. Transistor 10 is typically part of an integrated circuit with connections on the same level through interconnection 18, and connections to other levels (not shown) through interconnection 20.

Figure 2:
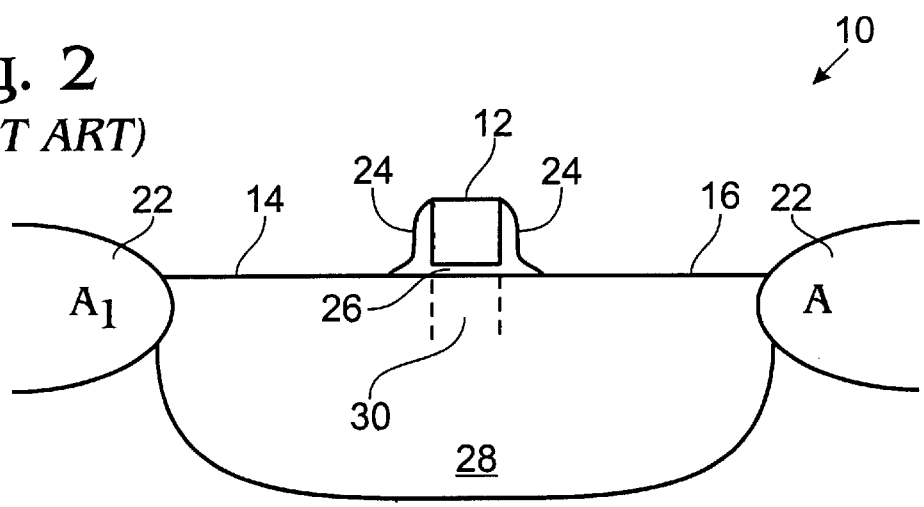

FIG. 2 is a partial cross-sectional view of transistor 10 of FIG. 1 (prior art). Transistor 10 is isolated from neighboring transistors with regions of field oxide 22. Associated with gate electrode 12 are vertical insulating gate sidewalls 24 and a gate oxide layer 26 underlying gate electrode 12. Gate 12 has been formed overlying a well of silicon 28 previously implanted with dopant. Channel area 30 is approximately defined between the broken lines underlying gate oxide layer 26.

Figure 3:
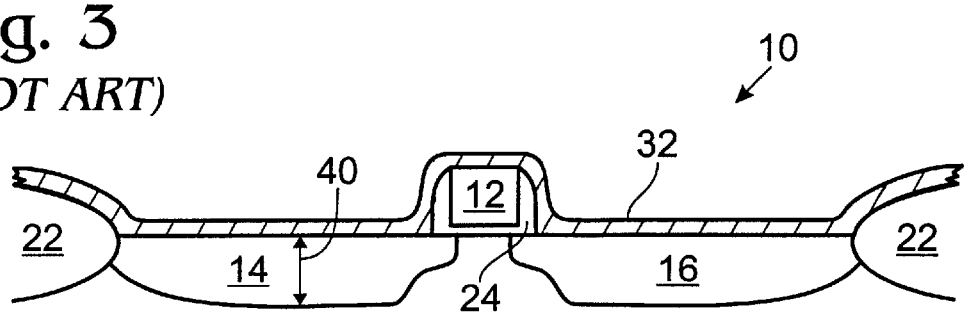

FIG. 3 is a partial cross-sectional view of transistor 10 of FIG. 2 after the deposition of a silicidation metal 32 (prior art). Metal layer 32 has been deposited overlying source 14, drain 16, gate electrode 12, sidewalls 24, and field oxide regions 22.

Figure 4:
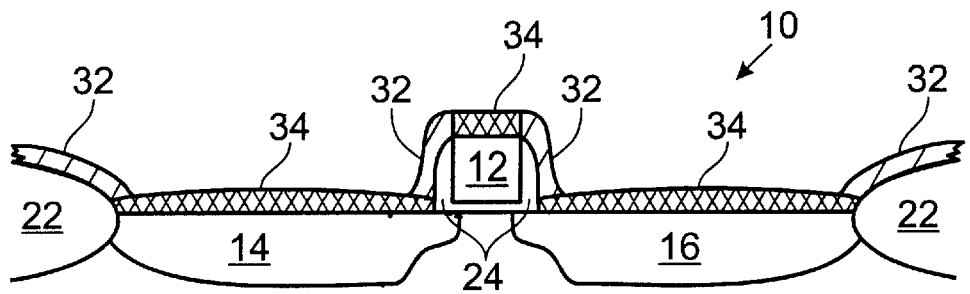

FIG. 4 is a partial cross-sectional view of transistor 10 of FIG. 3 during the silicidation of source/drain electrodes 14/16 (prior art). Transistor 10 is being annealed, reacting metal 32 to silicon, to form a layer of silicide 34 overlying source/drain 14/16. Silicide layer 34 is often formed overlying gate electrode 12 in the same process. Typically, transistor 10 is annealed until unreacted metal 32 (FIG. 3) overlying source/drain 14/16 is consumed, and silicide layer 34 forms. However, the exact timing of this process is difficult to determine. Often, unreacted metal 32 adjoining source/drain 14/16, on oxide sidewalls 24 and field oxide regions 22, continues the silicidation of the silicon.

Figure 5:
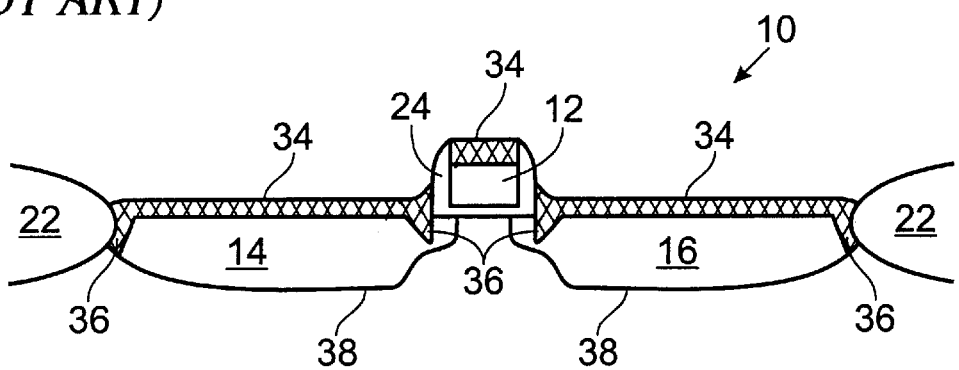

FIG. 5 is a partial cross-sectional view of transistor 10 of FIG. 5 showing perturbations, or intrusions 36 of silicide formed in the silicon of source/drain 14/16 after annealing (prior art). Severe perturbations extending through source/drain junction areas 38 are sometimes called junction spikes (not shown). Perturbations 36 potentially occur at any boundary region between source/drain 14/16 and a neighboring oxide region (22 and 24). After the silicidation process, unreacted metal 32 overlying oxide regions 22 and 24 is removed. Source/drain regions 14/16 undergo another step of dopant ion implantation, either before or after silicidation, to form source/drain junction areas 38 with a junction depth 40 (as defined in FIG. 3). Silicide incursions 36 disrupt the intended electrical fields, resulting in leakage current. Alternately, to prevent leakage current, junction depth 40 (FIG. 3) must be increased.

FIGS. 6–10 are steps in the fabrication of a completed MOS transistor made in accordance to the present invention, having shallow source/drain junctions with low leakage current. FIGS. 1–5, which describe prior art fabrication techniques, are also applicable to the initial fabrication of the present invention. Typically, a transistor 46, similar to transistor 10 of FIG. 1, is formed by isolating a well of silicon with a local oxidation of silicon (LOCOS) or shallow trench isolation (STI) techniques. Then, the well is doped through ion implantation and diffusion. Oxide is deposited for the gate oxide layer. Polysilicon is deposited, often through chemical vapor deposition (CVD), selectively doped, and etched to form a gate electrode. The silicon well is given a low density doping (LDD) and gate sidewalls are formed.

Figure 6:
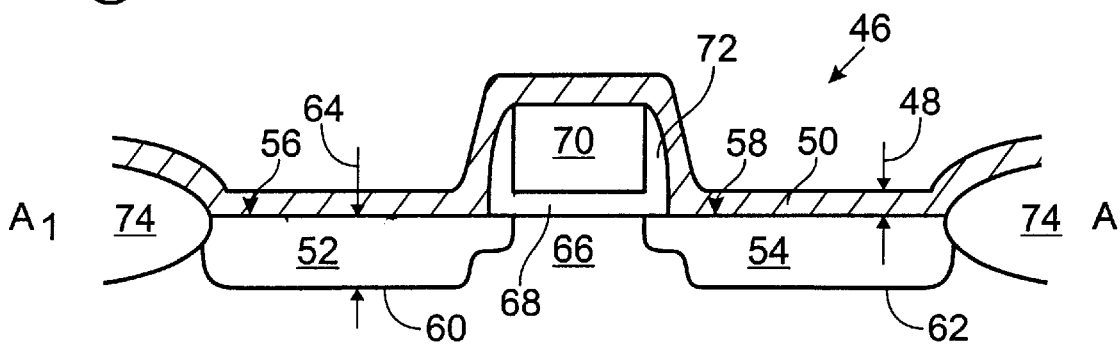
FIGS. 6–10 are steps in the fabrication of a completed MOS transistor made in accordance to the present invention, having shallow source/drain junctions with low leakage current.

FIG. 6 is a partial cross-sectional view of transistor 46 after the deposition of a predetermined thickness 48 of metal 50. Metal thickness 48 is in the range between 50 and 1000 Å. Silicidation metal 50 is selected from the group consisting of Co, Ni, Ti, Mo, Ta, W, Cr, Pt, and Pd, although Ni, and especially Co are generally preferred. Transistor 46 comprises silicon source/drain regions 52/54 having, respectively, top surfaces 56 and 58. Transistor 46 also comprises source/drain junction areas with metallurgical edges 60 and 62 at a predetermined junction depth 64 from said respective top surfaces 56 and 58. Transistor 46 further comprises a channel region 66 between source/drain regions 52/54. A layer of gate oxide 68 overlies channel region 66, and a gate electrode 70, with vertical sidewalls 72, overlies gate oxide layer 68. Once metal layer 50 is deposited, metal 50 and silicon source/drain regions 54/56 are partially silicided at a first predetermined annealing temperature for a first predetermined period of time.

Figure 7:
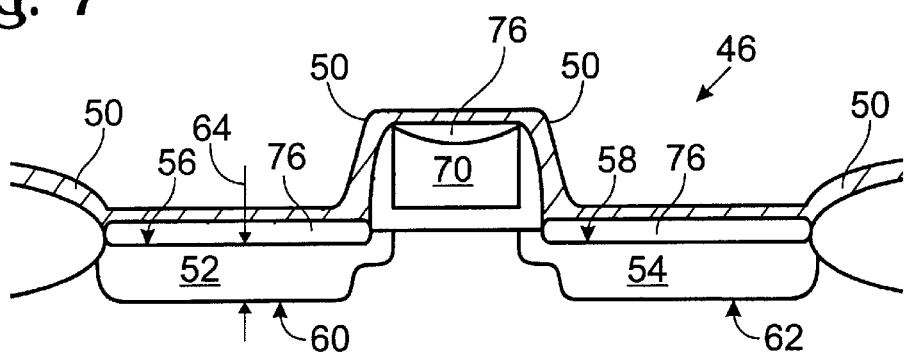

FIG. 7 is a partial cross-sectional view of transistor 46 following the first annealing step. When silicidation metal 50 is Co, the first annealing temperature is in the range between 350 and 500 degrees C. and the first period of time is in the range between 2 and 20 seconds. When silicidation metal 50 is Nit the first annealing temperature is in the range between 200 and 400 degrees C. and the first period of time is in the range between 2 and 20 seconds. When source/drain top surfaces 56/58 are amorphousized, as explained below and described in FIG. 16, the first annealing temperature is dropper approximately 50 degrees C. To generally cover all situations, the first annealing temperature is 300 to 500 degrees C. with Co, and 150 to 400 degrees C. with Ni.

The silicidation process is carried out at low temperatures and short periods of time to insure that metal 50 is not totally consumed in a reaction with the silicon of source/drain regions 52/54. A portion of metal 50 is shown overlying the resulting silicide layer 76. Silicide layer 76 is formed from consuming silicon from top surfaces 56 and 58, and from consuming metal layer 50. Thus, the spacing between top surfaces 56 and 58 and metallurgical edges 60 and 62 is reduced slightly after annealing. For the sake of clarity in defining junction depth 64, the position of top surfaces 56 and 58 is defined as their position before annealing, as shown in FIG. 6. Metallurgical edges 60/62 are defined as the boundary between respectively, source/drain 52/54 and the underlying silicon well. Junction depth 64, defined as the distance between source/drain top surfaces 56/58 and source drain junction area metallurgical edges 60/62, is in the range between 300 and 2000 Å.

Figure 8:
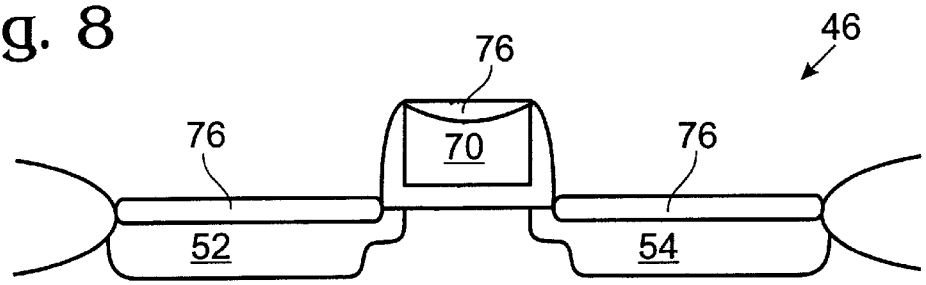

FIG. 8 is a partial cross-sectional view of transistor 46 of FIG. 7 following the removal of unreacted metal 50. Only metal-rich layer of silicide 76 remains.

Figure 9:
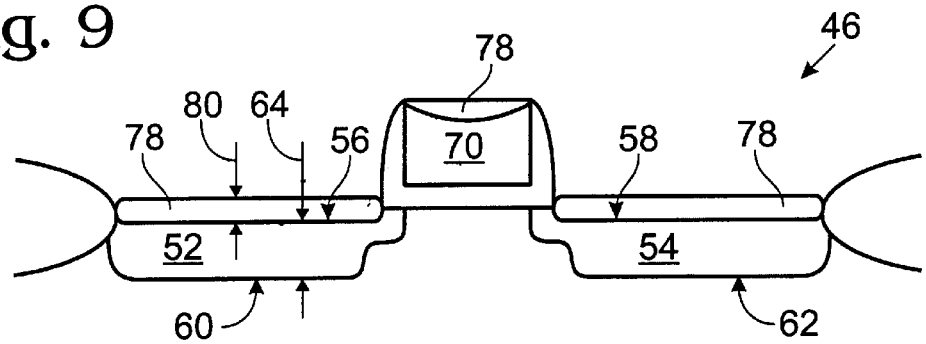

FIG. 9 is a partial cross-sectional view of transistor 46 of FIG. 8 following a second step of annealing. Low resistance silicide layers 78, having a predetermined nominal suicide layer thickness 80, overlie source/drain top surfaces 56 and 58. Typically, low resistance silicide layer 78 is a disilicide compound, such as $CoSi_2$. In some aspects of the invention, such as when silicidation metal 50 is Ni, low resistance silicide 78 is a mono-silicide (NiSi). Silicidation is completed at a second predetermined annealing temperature for a second predetermined period of time, whereby the spacing between metallurgical edges 60/62 and silicide layer 78 is maximized by preventing the perturbations of silicide 78 on source/drain top surfaces 56/58. When silicidation metal 50 is Co, the second annealing temperature is in the range between 600 and 850 degrees C. and the second period of time is in the range between 10 and 60 seconds. When silicidation metal 50 is Ni, the second annealing temperature is approximately 500 degrees C. and the second period of time is in the range between 10 and 30 seconds.

Figure 10:
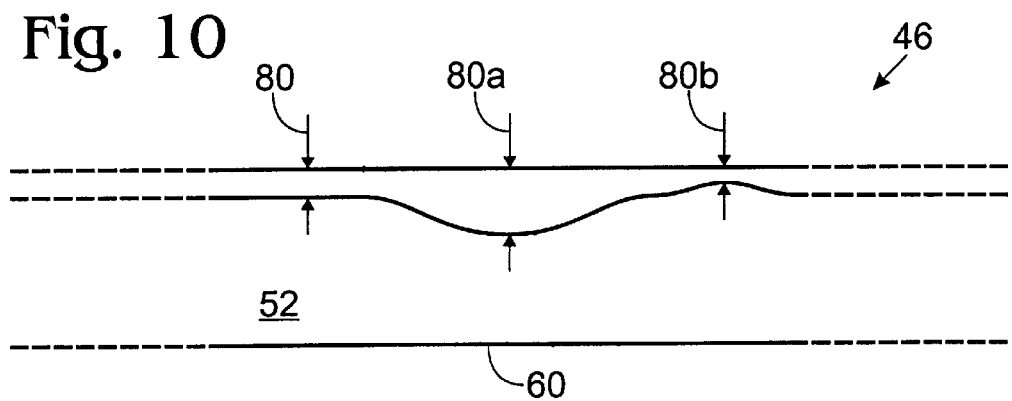

FIG. 10 is an expanded of source 52 of FIG. 9, defining nominal thickness 80 and the silicide thickness tolerance. Silicide layer 78 has a nominal thickness 80 and a tolerance which is less than 50% of nominal thickness 80. Nominal thickness is defined as the sum of maximum thickness 80*a* plus minimum thickness 80*b*, divided by 2. The tolerance is defined as the difference between maximum silicide thickness 80*a* and minimum silicide thickness 80*b*, divided by 2. Silicide nominal thickness 80 is in the range between 100 and 500 Å.

The edge of a silicided junction is a major source of leakage current in very shallow junction devices, when using cobalt silicide. The leakage current is not correlated proportionally to the area of the junction, but primary to the edge of the junction. To prevent leakage current, a partial reaction method for salicide process was developed. A low leakage current of about 10 $nA/cm^2$ for $P^+/N$ junctions with depths shallower than 1500 Å, and sheet resistances of about 5 ohm/sq. are reproducibly achieved by the method of this invention.

Figure 11A:
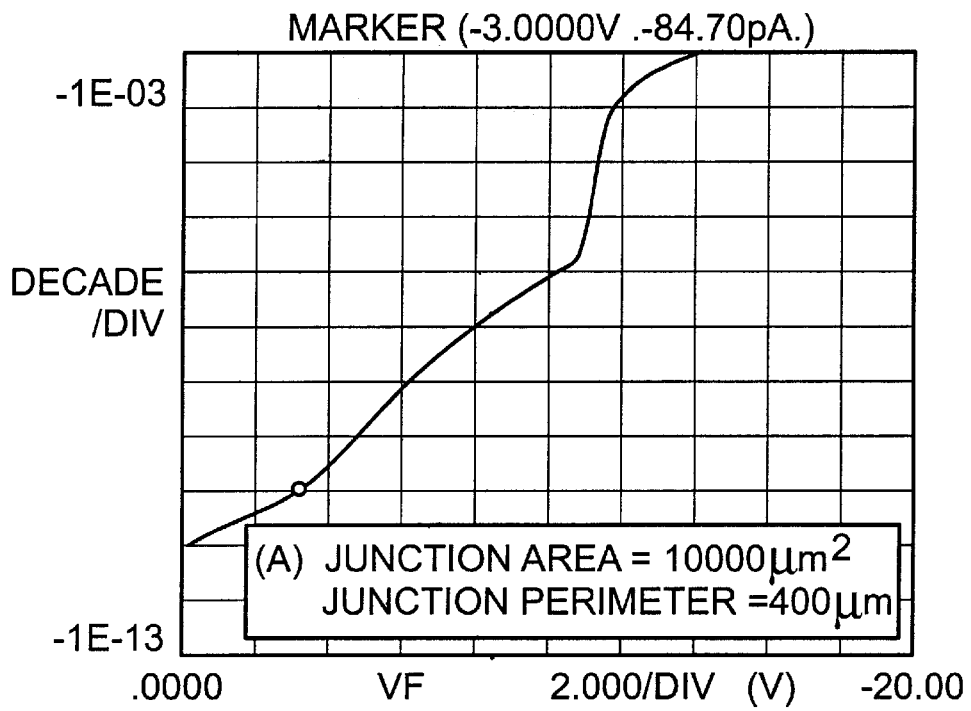
FIGS. 11a and 11b are graphs illustrating electrical characteristics resulting from the edge effect of silicided shallow junctions.
Figure 11B:
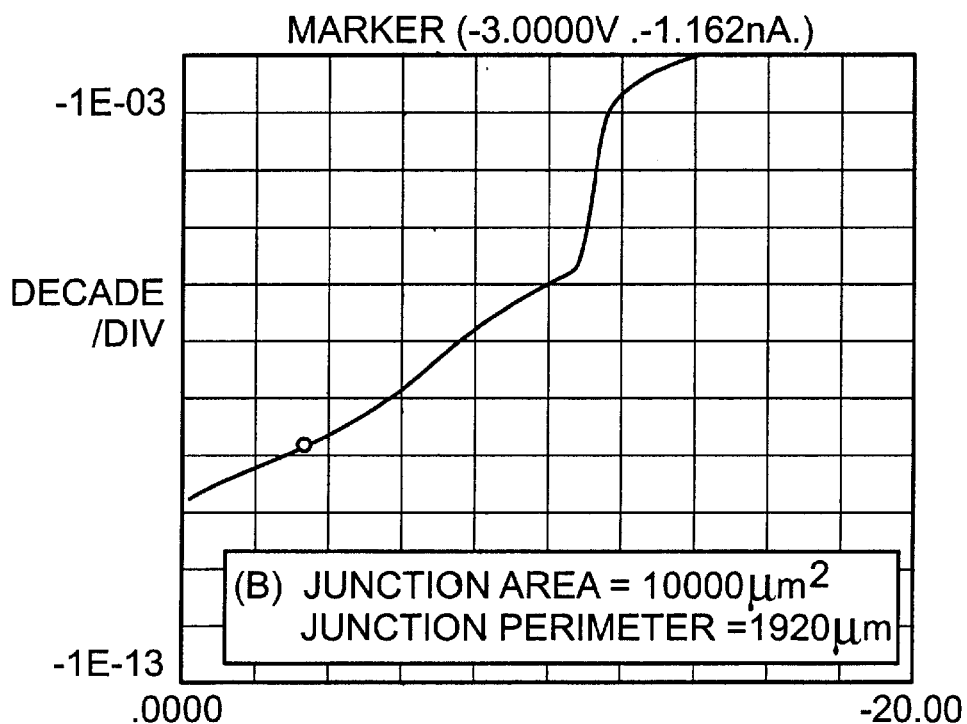

FIGS. 11*a* and 11*b* are graphs illustrating electrical characteristics resulting from the edge effect of salicided shallow junctions. The $P^+/N$ junctions are formed by implanting 60 keV $BF_2$ at a dose of $4 \times 10^{15}$ $cm^{-2}$ and followed by an activation anneal at 850° C. for 30 minutes. Cobalt salicides are formed using a two-step anneal (650° C./30 sec+850° C. 130 sec) after the junction formation. A Ti/Co bi-layer salicide process is started with 20 Å thick titanium and 140 Å thick cobalt films. A junction depth of about 2300 Å was determined by a secondary ion mass spectrometry (SIMS) depth profile. A silicide thickness of about 460 Å is estimated, based on sheet resistance.

The I-V characteristics are measured on two types of test structures; a rectangular structure with a 400 micrometer ($\mu$m) perimeter, and a serpentine structure with a 1920 $\mu$m perimeter. The junction area for both structures is 10000 $\mu m^2$. The reverse I-V curves from a rectangular structure and a serpentine structure are shown in FIGS. 9*a* and 9*b*, respectively. The junction leakage currents are strongly dependent on the edge length. The leakage current from the serpentine structure is more than one order of magnitude higher than that from the rectangular structure. These results were also observed from P+/N and N+/P junctions, formed from single layer cobalt or Ti/Co bi-layer, with silicide thickness ranging from 300 to 600 Å, and implantation energy varying from 20 to 70 keV for BF$_2$ and arsenic, respectively.

Since leakage current is not dependent on junction area, and junction leakage current is much greater with higher edge to area ratios, it is concluded that the main source of leakage is from the edge of the salicide area, not from the junction area. After completing the silicidation of the silicon area, there is still an abundant metal supply on the spacer oxide adjoining the gate electrode and the field oxide region. Silicidation continues downward along the edge of spacer and field oxide due to the extra supply of metal. Severe junction leakage may occur even if the silicide does not penetrate through the junction.

The key to eliminating the edge effect is either to stop the extra supply of the metal source, or to create a silicidation condition that is independent of the edge. To this end, a low temperature partial reaction process was developed. A thick layer of metal is deposited. The wafer is annealed at relatively low temperatures so that only part of the metal is reacted with silicon to form metal-rich silicide. During this low temperature annealing, the metal supply for the silicide reaction is the same for the entire silicon area. Therefore, silicidation condition in the edge is no different than the center. After the low temperature partial reaction step, the wafers are etched in a piranha solution and followed by a second anneal to convert the silicides to disilicides.

Figure 12:
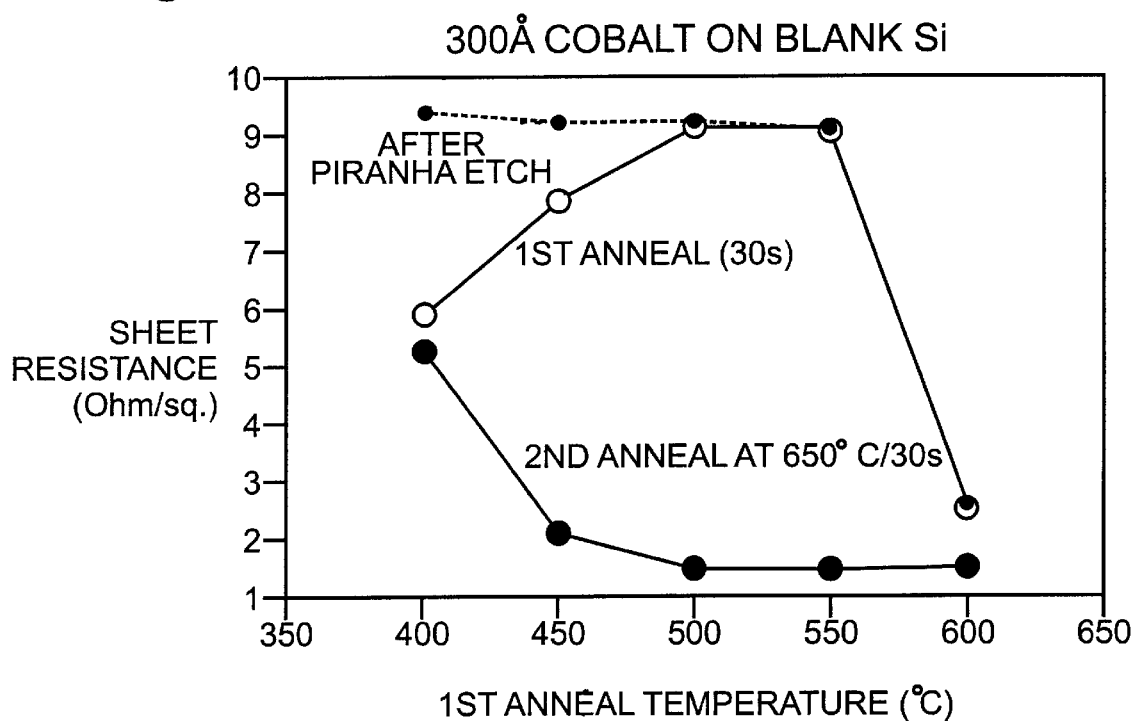
FIG. 12 is a graph illustrating sheet resistance as a function of anneal temperatures.

FIG. 12 is a graph illustrating sheet resistance as a function of anneal temperatures. A single layer cobalt film, 300 Å thick, on a 6" blank silicon wafer is used. Open circles present the sheet resistance as a function of first anneal temperature. Mono-silicide dominates phase in the temperature range of 500–550° C. Phases of Co, Co$_2$Si, and CoSi are present for temperatures lower than 500° C. The disilicide phase dominates at temperatures higher than 550° C. After piranha etch, the sheet resistance is shown as close circles with a dashed line. The difference between these two curves is indicative of the partial silicide reaction at low anneal temperatures. After piranha etch, a second anneal at 650° C. for 30 seconds is performed. The sheet resistance is shown as closed circles with a solid line. The high sheet resistance for the wafer annealed at low temperatures is expected because of the partial reaction. A first anneal temperature ranging from 400 to 450° C. is used for preparing the shallow junctions with this partial reaction process.

Figure 13A:
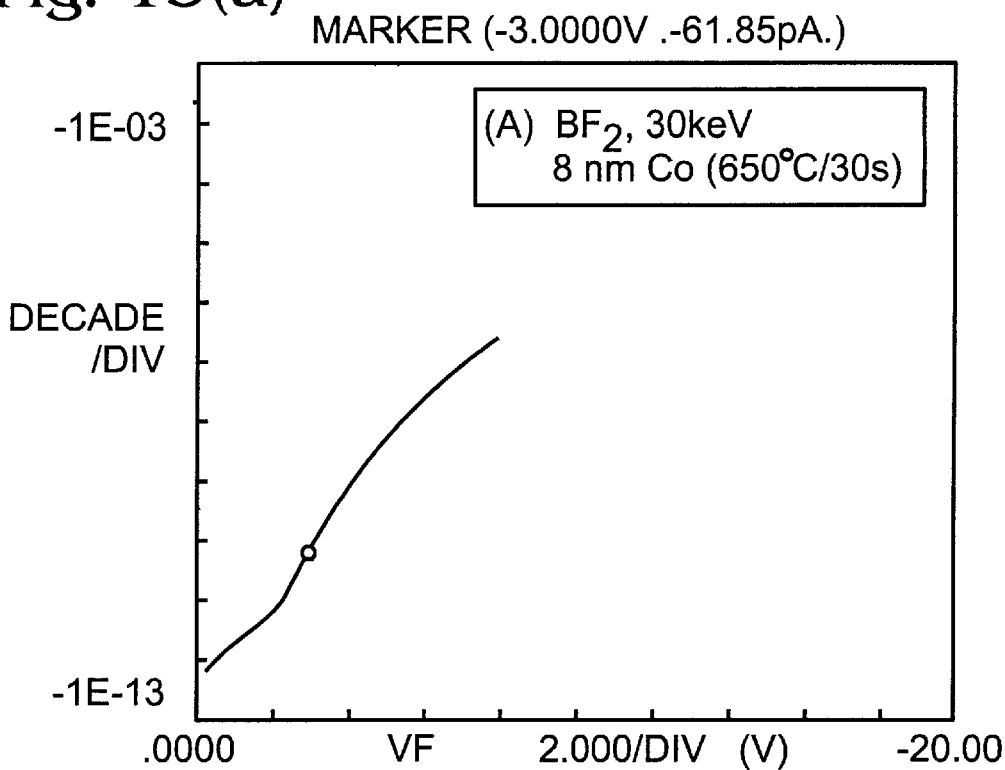
FIGS. 13a and 13b are graphs illustrating the reverse I-V curves of $P^+/N$ shallow junctions prepared with thin and thick cobalt films.
Figure 13B:
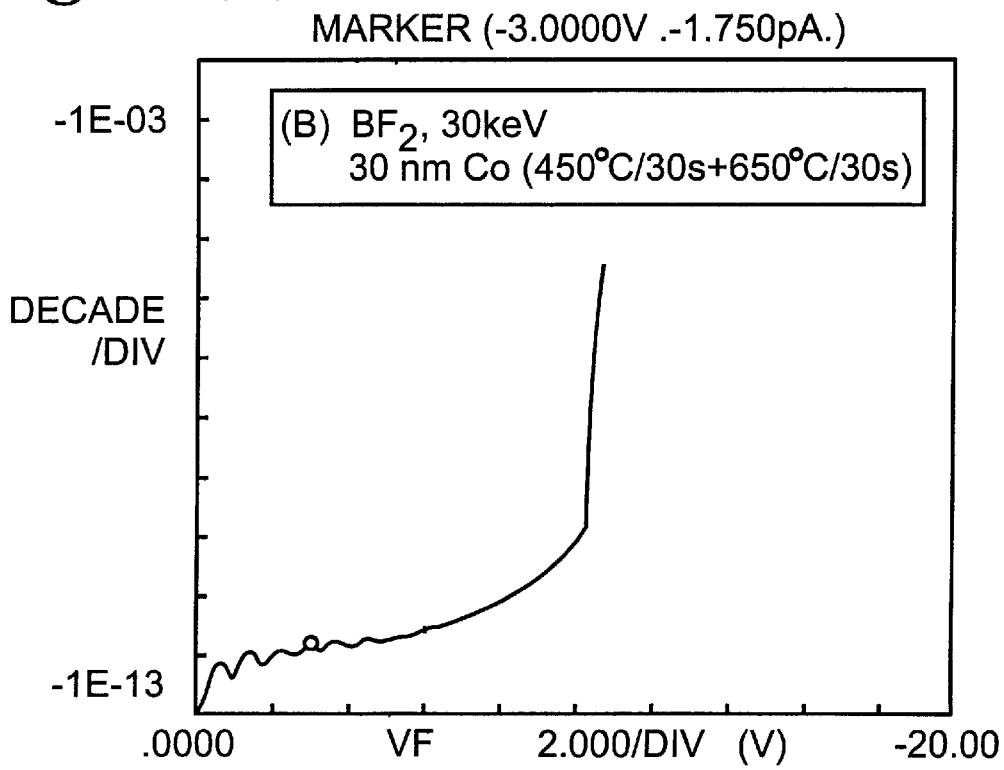

FIGS. 13a and 13b are graphs illustrating the reverse I-V curves of P+/N shallow junctions prepared with thin and thick cobalt films. The BF$_2$ implantation energy is 30 keV. A one-step anneal process (650° C./30s+piranha etch) is used for the case of thin cobalt film. The partial reaction process (450° C./30s+piranha etch+650° C./30s) is used for the case of thick cobalt film. A high leakage current is observed from wafers started with thin cobalt film due to the edge effect. However, wafers with thick cobalt film prepared through the partial reaction process show a high quality junction, because of the uniform silicide formation.

Figure 14A:
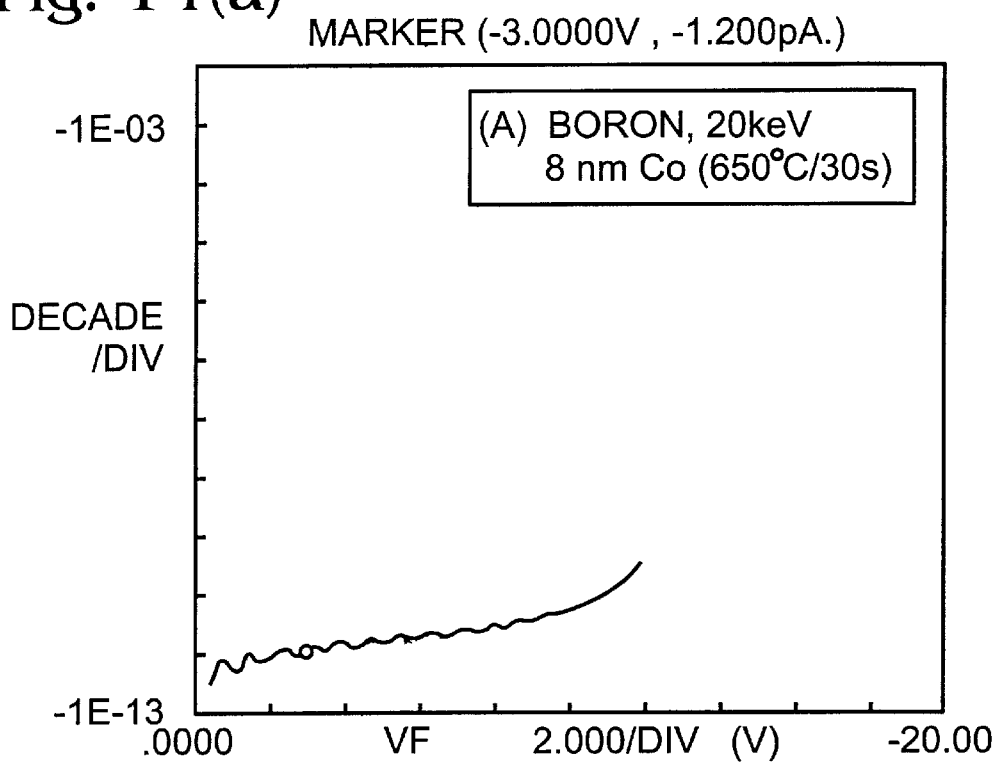
FIGS. 14a and 14b are graphs illustrating electrical characteristics of wafers prepared in an identical process as the wafers of FIG. 11, except with 20 keV boron implantation.
Figure 14B:
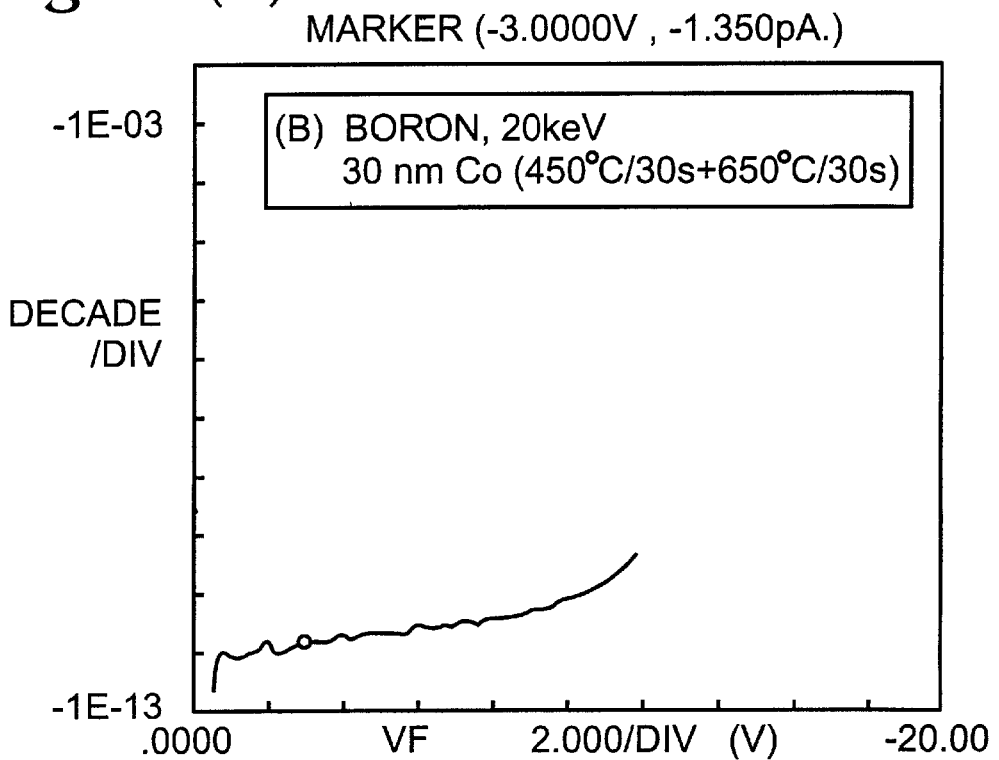

FIGS. 14a and 14b are graphs illustrating electrical characteristics of wafers prepared in an identical process as the wafers of FIG. 13, except with 20 keV boron implantation. Because of the much deeper junctions, both wafers show low leakage currents. That is, the edge effect disappears in the case of deep junctions.

Similar low leakage results are obtainable for N+/P junctions. The key parameter in this partial silicidation process is the first annealing condition. Proper temperature and time are chosen to ensure a proper thickness of the final silicide film and to avoid the complete reaction of Co/Si. The techniques of the present invention permit them fabrication of transistors having leakage currents lower than 10 nA/cm$^2$, for junction depths of 1500 Å, or less. The corresponding sheet resistance is about 5 ohm/sq.

Figure 15:
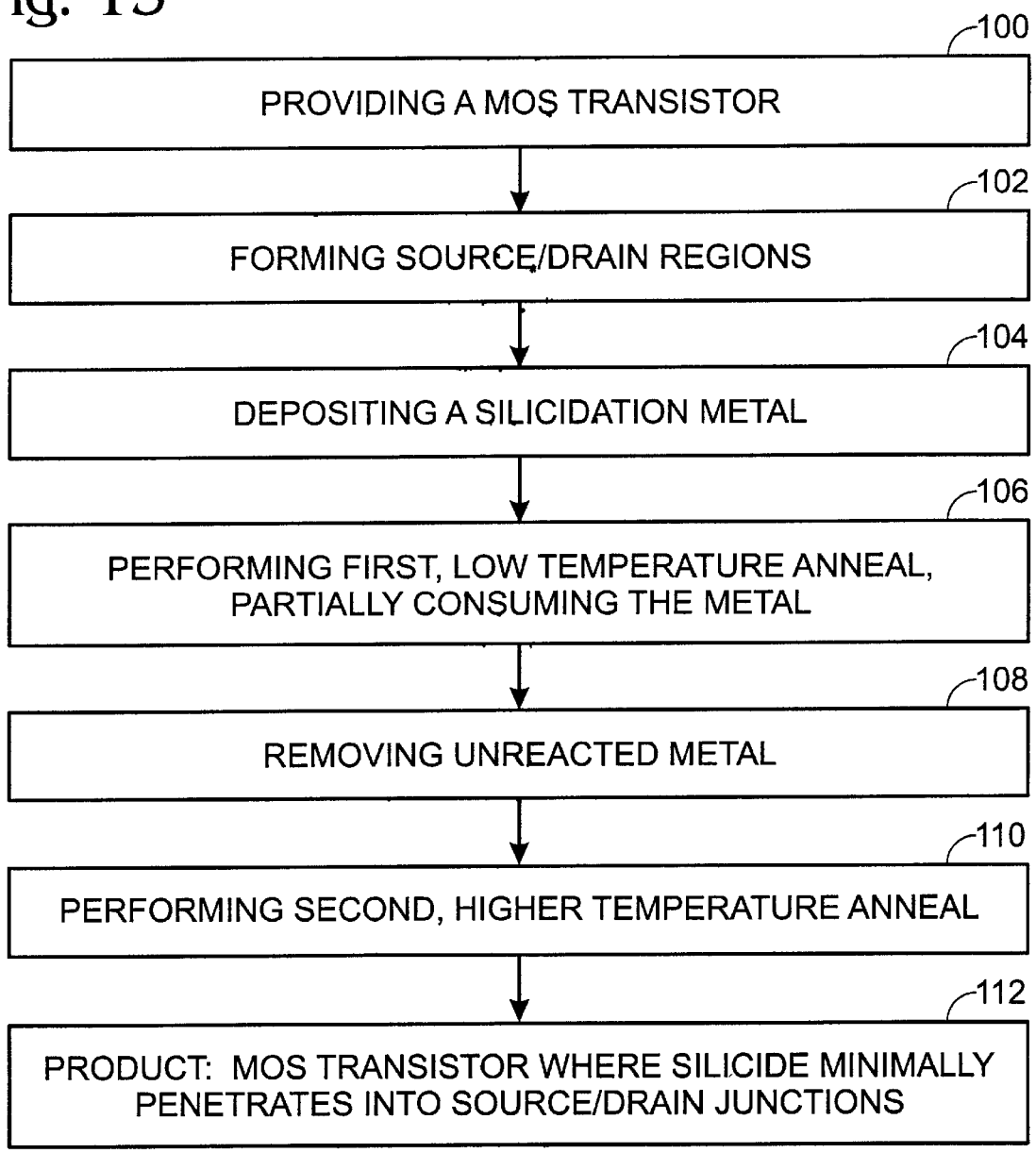
FIG. 15 is a flow chart illustrating steps in a method of forming shallow source/drain junctions with low leakage currents.

FIG. 15 is a flow chart illustrating steps in a method of forming shallow source/drain junctions with low leakage currents. Step 100 provides a MOS transistor. Step 102, in a silicon well, forms silicon source/drain regions with top surfaces and an edge around the perimeter of the top surfaces. A gate electrode is formed overlying the silicon well, adjoining the source/drain top surfaces. Step 104 deposits a layer of metal, having a predetermined metal thickness over the transistor. Step 104 includes a silicidation metal selected from the group consisting of Co, Ni, Ti, Mo, Ta, W, Cr, Pt, and Pd. When Step 104 includes using Co and Ni as the silicidation metal, the thickness of metal is in the range between 50 and 1000 Å. Step 106 performs a first annealing of the metal deposited in Step 104 at a first predetermined temperature for a first predetermined period of time, to partially react the metal with the silicon of the source/drain top surfaces, whereby metal-rich silicide compounds are formed. When Step 104 includes using Co as the silicidation metal, Step 106 includes the first temperature being in the range between 300 and 500 degrees C. and the first period of time being in the range between 2 and 20 seconds. When Step 104 includes using Ni as the silicidation metal, Step 106 includes the first temperature being in the range between 150 and 400 degrees C. and the first period of time being in the range between 2 and 20 seconds.

Step 108 removes the metal deposited in Step 104 not silicided in Step 106, whereby silicide compounds remain on the source/drain top surfaces. Step 110 performs a second annealing of the silicide compounds formed in Step 106 at a second predetermined temperature for a second predetermined period of time, to complete the reaction of the metal and the silicon, forming a low resistance silicide layer overlying the source/drain top surfaces. When Step 104 includes using Co as the silicidation metal, Step 110 includes the second temperature being in the range between 600 and 850 degrees C. and the second period of time being in the range between 10 and 60 seconds. When Step 104 includes using Ni as the silicidation metal, Step 110 includes the second temperature being approximately 500 degrees C. and the second period of time being in the range between 10 and 30 seconds.

Step 110 includes the silicide layer having a predetermined silicide thickness in the range between 100 and 500 Å. The nominal thickness is defined as the maximum silicide layer thickness plus the minimum silicide thickness, divided by 2. The silicide layer has a silicide thickness tolerance which is less than 50% of the silicide thickness, and is defined as the max thickness minus the min thickness, divided by 2. Step 112 is a product, a MOS transistor where silicide minimally penetrates into the silicon on the source/drain top surfaces.

In some aspects of the invention, the source/drain junction areas are formed before salicidation. Then, a further step, following Step 102, and preceding Step 104, is inserted into the process. Step 102a (not shown) implants the source/drain regions with dopant ions and anneals to form source/drain junction areas with metallurgical edges at a predetermined junction depth (as defined above and shown above in the discussion of FIG. 6) from the source/drain top surfaces. Step 102a includes the junction depth being in the range between 300 and 2000 Å, whereby the prevention of thick silicide growth at the source/drain edges maximizes the spacing between the silicide layer and the junction areas.

In some aspects of the invention, source/drain junction areas are formed after silicidation. Then, the process includes a further step, following Step 110. Step 110a (not shown) implants the source/drain regions with dopant ions and anneals to form source/drain junction areas with metallurgical edges at a predetermined junction depth (300–2000 Å) from the source/drain top surfaces. The prevention of thick silicide growth at the source/drain edges maximizes the spacing between the silicide layer and the junction areas.

In a preferred alternate embodiment of the invention, an additional step follows Step 102, and precedes Step 104. Step 102b (not shown) amorphousizes the crystalline structure of the source/drain top surfaces, whereby the source/drain top surfaces are prepared for the process of silicidation. The success of the partial silicidation method is the additional control it lends to silicidation process. Control over silicidation is further heightened with the proper preparation of the source/drain top surfaces. Typically, the source and drain are comprised of single crystal silicon. The silicon substrates are usually single crystal, and single crystal silicon transistors provide the highest electron mobility. However, it has been found that when the crystalline structure of the source/drain top surfaces are changed from single crystal to amorphous, the rate of silicidation is improved. The improved rate of silicidation allows the first annealing temperature to be reduced approximately 50 degrees C. The reduced annealing temperature means that single crystal silicon between the intended silicidation later and the junction area is even less likely to form into silicide. That is, the silicide layer remains flatter, or has a reduced thickness tolerance in response to forming a flat amorphous layer before the deposition of metal.

Step 102b includes amorphousizing a predetermined thickness of the top surfaces in the range between 100 and 500 Å. The source/drain top surfaces are amorphousized with a radio frequency (RF) plasma using a gas selected from the group consisting of Ar, Kr, and Xe, at a pressure in the range between 5 and 50 milli-Torr, an RF power level in the range between 0.15 and 2 watts/cm$^2$, and a time in the range between 3 seconds and 2 minutes. Alternately, the source/drain top surfaces are amorphousized with a ion beam bombardment using a high density plasma source.

Figure 16:
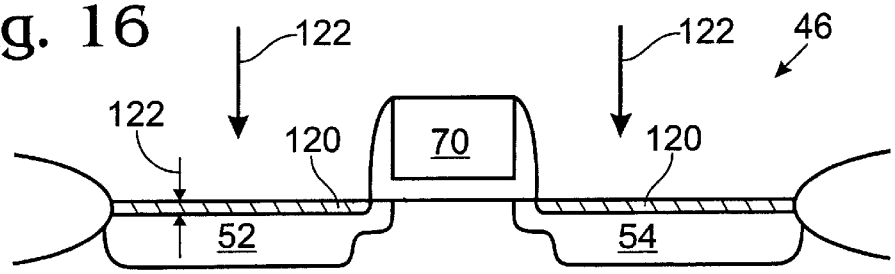
FIG. 16 is a partial cross-sectional view of the MOS transistor of the present invention following amorphousization of the source/drain top surfaces.

Returning to FIGS. 6–10, in a preferred alternate embodiment of the invention, the formation of low resistance silicide layer 78 includes the process, preceding the deposition of metal layer 50, of amorphousizing source/drain top surfaces 56/58. FIG. 16 is a partial cross-sectional view of MOS transistor 46 of the present invention following amorphousization of source/drain top surfaces 56/58. Since the amorphousizing process is alternately inserted into the fabrication process before the deposition of metal 50, FIG. 16 should be understood to be a view of transistor 46, occurring before FIG. 6.

Amorphous layer 120 of source/drain top surfaces 56/58 are amorphousized with a radio frequency (RF) plasma using a gas selected from the group consisting of Ar, Kr, and Xe, at a pressure in the range between 5 and 50 milli-Torr, an RF power level in the range between 0.15 and 2 watts/cm$^2$, and a time in the range between 3 seconds and 2 minutes. The depth of amorphous layer 120 is schematically represented by reference designator 122. Alternately, source/drain top surfaces 56/58 are amorphousized with a ion beam bombardment 122 using a high density plasma source. Both the high density plasma source and RF plasma techniques are convention cleaning techniques used to remove oxides from a surface. However, proper control of the equipment permits the development of a controlled amorphous layer 120. A predetermined thickness 122 of source/drain top surfaces 56/58 is amorphousized in the range between 100 and 500 Å.

A transistor, and fabrication method for making a transistor having a shallow junction area and silicided electrodes is provided. The method of the present invention encourages the formation of flat, uniformly thick silicide layers on the source drain electrodes. Minimizing the incursion of silicide into the source/drain regions promotes small leakage currents. The uniformly thick disilicide layers, or low resistance silicide layers are the result of being able to form silicide on the edges of the source/drain silicon at the same rate as it is formed in the center of the electrodes. Amorphousization of the source/drain top surfaces permits the (first) annealing temperatures to be reduced, further limiting the growth of silicide into the junction areas. Other variations and embodiments of the instant invention will occur those skilled in the arts.

What is claimed is:

1. An interim structure formed during the fabrication of silicided shallow source/drain regions in a MOS transistor, the interim structure being formed preceding the deposition of silicidation metal on the source/drain regions, the interim structure comprising:

a single crystal silicon substrate;

on the surface of the substrate, in a transistor region of the substrate isolated from adjacent transistor regions, a gate electrode and gate sidewalls, providing a MOS transistor gate;

source/drain regions formed in said substrate on opposite sides of said gate, said source/drain regions each having, respectively, a top surface and each extending into said substrate from said surface thereof to a source/drain junction depth;

each said source/drain region further including an amorphous layer of said silicon substrate formed of amorphousized single-crystal silicon extending from the surface of the substrate into each respective source and drain region, the thickness of said amorphous layer in each said source/drain region being less than said source/drain junction depth, whereby said top surfaces of said source/drain regions are prepared for silicidation.

2. An interim structure as in claim 1 in which said junction depth of said source/drain regions is in the range between 300 and 2000 Å and said amorphous layer in each said source/drain region has a thickness in the range between 100 and 500 Å.

* * * * *